(12) United States Patent
Hatch et al.

(10) Patent No.: US 10,531,568 B1
(45) Date of Patent: Jan. 7, 2020

(54) CIRCUIT BOARD INTERCONNECT DECALS

(71) Applicant: Honeywell Federal Manufacturing & Technologies, LLC, Kansas City, MO (US)

(72) Inventors: Stephen McGarry Hatch, Blue Springs, MO (US); Jonathan Douglas Hatch, Cleveland, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 16/253,362

(22) Filed: Jan. 22, 2019

(51) Int. Cl.
    *H05K 3/02*     (2006.01)
    *H05K 3/06*     (2006.01)
    *H05K 3/04*     (2006.01)
    *C09J 7/29*     (2018.01)

(52) U.S. Cl.
    CPC ............. *H05K 3/048* (2013.01); *C09J 7/29* (2018.01); *H05K 2203/0121* (2013.01); *H05K 2203/0186* (2013.01); *H05K 2203/0557* (2013.01)

(58) Field of Classification Search
    CPC ............................................. H05K 3/022–048
    See application file for complete search history.

(56) References Cited

U.S. PATENT DOCUMENTS

| | | | | |
|---|---|---|---|---|
| 3,649,273 | A * | 3/1972 | Miller | G03F 1/90 430/5 |
| 3,737,986 | A * | 6/1973 | Cranston | B23K 20/08 228/106 |
| 3,868,724 | A | 2/1975 | Perrino | |
| 5,017,255 | A * | 5/1991 | Calhoun | B41M 1/22 156/230 |
| 5,561,011 | A * | 10/1996 | Miyazaki | G02F 1/133512 430/293 |
| 5,679,301 | A * | 10/1997 | Miklas | B29C 43/184 264/161 |
| 6,465,877 | B1 | 10/2002 | Farnworth et al. | |
| 2003/0024632 | A1* | 2/2003 | Hahn | B81C 1/00111 156/230 |

(Continued)

OTHER PUBLICATIONS

Webpage for CircuitHub, Inc.—On Demand Electronics Manufacturing; www.circuithub.com; 2018.

(Continued)

*Primary Examiner* — Hoa C Nguyen
(74) *Attorney, Agent, or Firm* — Hovey Williams LLP

(57) ABSTRACT

A circuit component decal comprising a transparent sheet and an opaque circuit pattern. The transparent sheet includes opposing top and bottom surfaces and a number of edges. The opaque circuit pattern includes an electronic component footprint and a number of circuit lead paths. The electronic component footprint includes a number of contact points representing the location of leads of the electronic component. The circuit lead paths extend from the contact points to the edges of the transparent sheet. The opaque circuit pattern corresponds to only a section of a complete circuit pattern and is configured to block energy from reaching a first portion of the intermediate substrate when the transparent sheet is positioned on the intermediate substrate so as to form the section of the complete circuit pattern.

20 Claims, 5 Drawing Sheets

(56) References Cited

U.S. PATENT DOCUMENTS

| | | | | |
|---|---|---|---|---|
| 2005/0260338 | A1* | 11/2005 | Chien | C03C 17/36 |
| | | | | 427/96.1 |
| 2007/0062723 | A1* | 3/2007 | Kim | H05K 3/002 |
| | | | | 174/255 |
| 2009/0136874 | A1* | 5/2009 | Kim | G03F 7/2018 |
| | | | | 430/311 |
| 2011/0217892 | A1* | 9/2011 | Chabrecek | B41F 15/34 |
| | | | | 442/60 |
| 2016/0270236 | A1* | 9/2016 | Hendriks | G03F 7/092 |
| 2017/0135220 | A1* | 5/2017 | Chadalavada | H05K 3/027 |
| 2018/0196326 | A1* | 7/2018 | Paolini, Jr. | H05K 3/027 |

OTHER PUBLICATIONS

Webpage for SnapEDA—Free PCB Footprints and Schematic Symbols; Build Circuit Boards Faster with Instant Parts; www.snapeda.com; 2019.

Webpage for JPS—Jaapson Blog Center—http://www.jps-pcb.com/blog/6-tips-for-choosing-pcb-components.html.

YouTube video; Make a PCB with Press & Peel blue transfer paper; https://www.youtube.com/watch?v=5YrkHCIYXLA.

Webpage for Hackaday; Take your Pcbs from Good to Great: Toner Transfer; https://hackaday.com/2016/09/12/take-your-pcbs-from-good-to-great-toner-transfer; Jan. 21, 2019 by Elliot Williams.

Webpage for Sunrom Electronics; PCB Ruler for Quick SMD Footprint and Dimensions Query; https://www.sunrom.com/p/pcb-ruler-for-quick-smd-footprint-dimensions-query.

* cited by examiner

CIRCUIT BOARD INTERCONNECT DECALS

GOVERNMENT INTERESTS

This invention was developed with government support under Contract No. DE-NA0000622 awarded by the United States Department of Energy. Accordingly, the U.S. Government has certain rights in the invention.

BACKGROUND

Circuit designs are often created with the help of Computer Aided Design (CAD) software. However, circuit components are time consuming and difficult to incorporate into the circuit designs because their footprints (i.e., electronic connection patterns) are not easily discernible or readily available. Circuit designers must therefore measure or research the circuit components and draw footprints and lead paths from scratch. Furthermore, circuit designs often change during development, which requires circuit designers to measure or research the replacement circuit components and draw new footprints and lead paths.

SUMMARY

Embodiments of the invention solve the above-mentioned problems and provide a distinct advancement in the art of PCB prototyping and manufacturing. More particularly, the invention provides a circuit component decal that allows circuit designers to integrate circuit components into circuit designs without determining their footprints and drawing the footprints and associated lead paths.

An embodiment of the present invention is a circuit component decal for incorporating a circuit component into a circuit prototype. The circuit component decal broadly includes a transparent sheet, an adhesive, a removable cover, and an opaque circuit pattern.

The transparent sheet includes opposing top and bottom sides and a number of edges. An embodiment of the transparent sheet is a small rectangular strip of rigid or flexible material and may be slightly larger in area than its corresponding circuit component.

The adhesive is applied to the bottom side of the transparent sheet for attaching the transparent sheet to an intermediate substrate. The adhesive may be glue, epoxy, or any other type of bonding material. The adhesive may cover the entire bottom side or may only be located in certain areas such as the corners or the middle of the bottom side. Alternatively, the adhesive may be applied to the transparent sheet immediately before being positioned on the intermediate substrate.

The removable cover is attached to the transparent sheet over the adhesive for temporarily protecting the adhesive. The removable cover may include a tab for allowing a user to peel the removable cover from the adhesive. The removable cover may be made of a material that only loosely bonds to the adhesive so that it can be easily removed therefrom. Alternatively, the removable cover may be at least partially connected to the transparent sheet via a perforated or crimped section.

The opaque circuit pattern is layered on the top side of the transparent sheet and includes an electronic component footprint and a plurality of circuit lead paths. The opaque circuit pattern may be printed, etched, or otherwise deposited on the transparent sheet. It will be understood that the opaque circuit pattern may alternatively be positioned between the adhesive and the bottom side or embedded in the transparent sheet. Importantly, the opaque circuit pattern represents only a section of a complete circuit pattern.

The electronic component footprint matches the relative spacing, layout, and/or pattern of leads of the circuit component and includes a plurality of contact points each corresponding to one of the leads. The contact points form contact pads, which may be small circles, rectangles, or any other suitable shape. The electronic component footprint may conform to an electronic component model, type, standard, or any other predetermined pattern or pattern characteristic.

The circuit lead paths extend from the contact points to the edges of the transparent sheet and may be straight lines or may have curves, turns, angles, diagonals, splits, junctions, and/or other features. Some of the circuit lead paths may extend between two contact points. In one embodiment, one of the circuit lead paths forms an RF antenna, such as an in-plane spiral antenna, or another circuit component.

The circuit component decal is prepared for use by peeling or removing the removable cover from the adhesive on the bottom side of the transparent sheet. The circuit component decal is then placed on an intermediate substrate such that the circuit lead paths align with and connect to circuit lines of other sections of a complete circuit pattern so as to form a complete mask.

The above-described circuit component decal provides several advantages. For example, the circuit component decal allows users to incorporate circuit components into electronic circuits without expertise or specific knowledge of the circuit components. This also significantly reduces the amount of time required to draft circuit designs, since users do not need to measure, research, or draw the footprints of the circuit components. In some embodiments, circuit components can easily be replaced in the design process with other circuit components having different footprints without having to draw new footprints and lead paths. Instead, the circuit component decal is replaced with a decal of another circuit component having the same lead paths. The circuit component decal is also compatible with selective adhesion procedures and can be incorporated into other circuit design and circuit manufacturing procedures.

The circuit component decal can instead include an opaque negative circuit pattern in which an opaque portion corresponds to non-conductive areas between conductive traces, leads, and contact points, while a transparent portion corresponds to the circuit pattern. Circuit design and application of the circuit component decal is substantially identical regardless of whether an opaque positive circuit pattern or an opaque negative circuit pattern is used.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
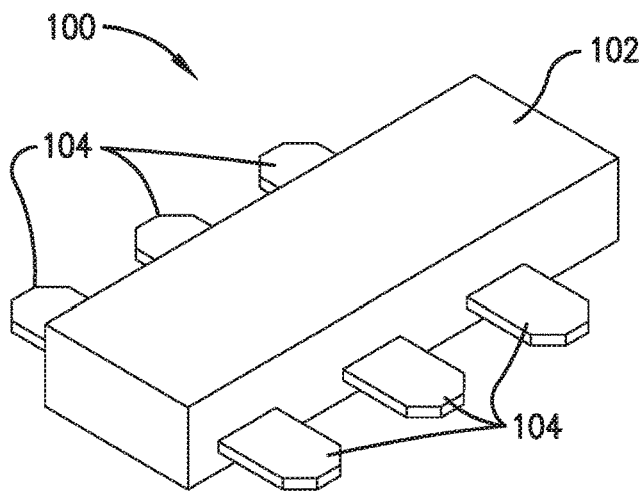
FIG. 1 is a perspective view of a circuit component configured for use with an embodiment of the invention.
Figure 2:
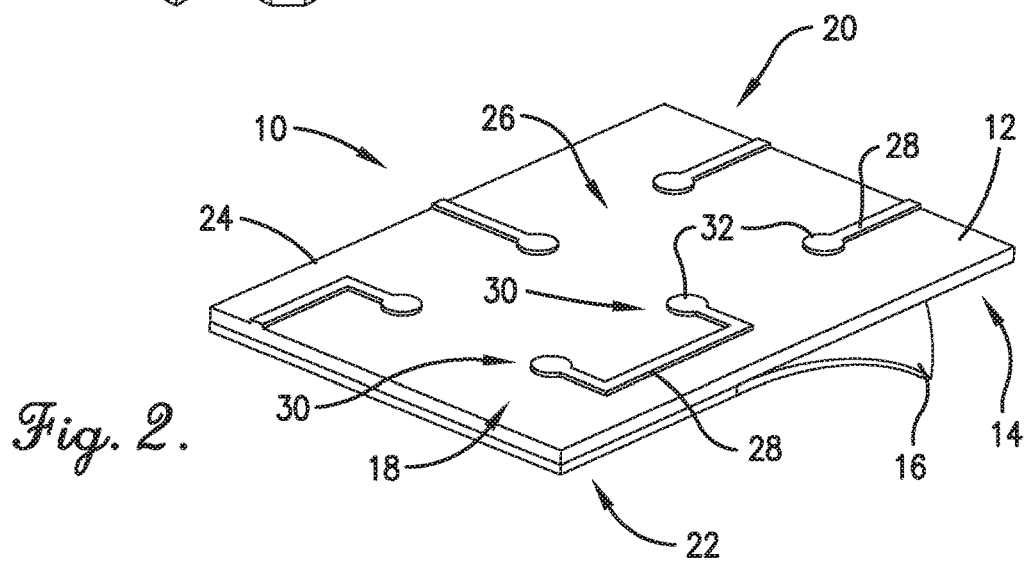
FIG. 2 is a perspective view of a circuit component decal constructed in accordance with an embodiment of the invention.
Figure 3:
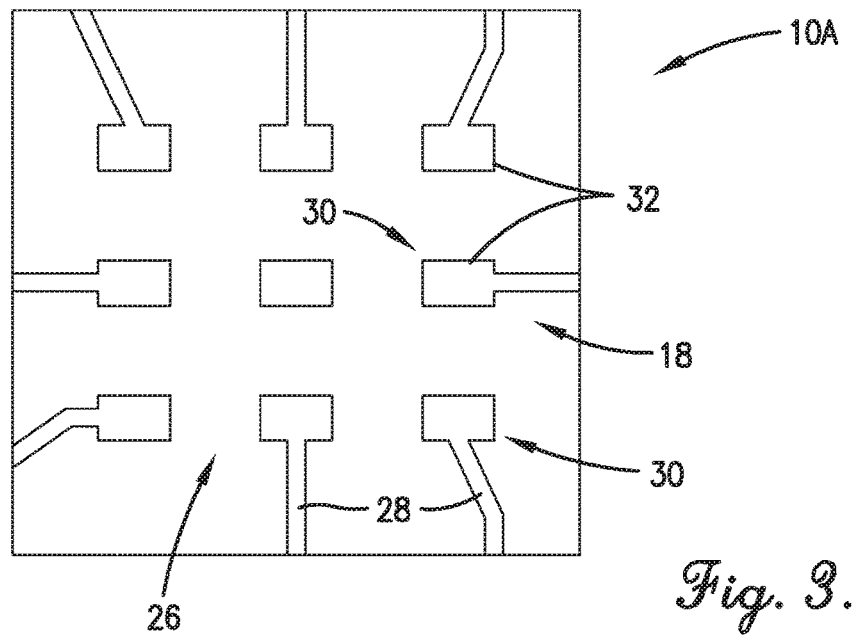
Figure 4:
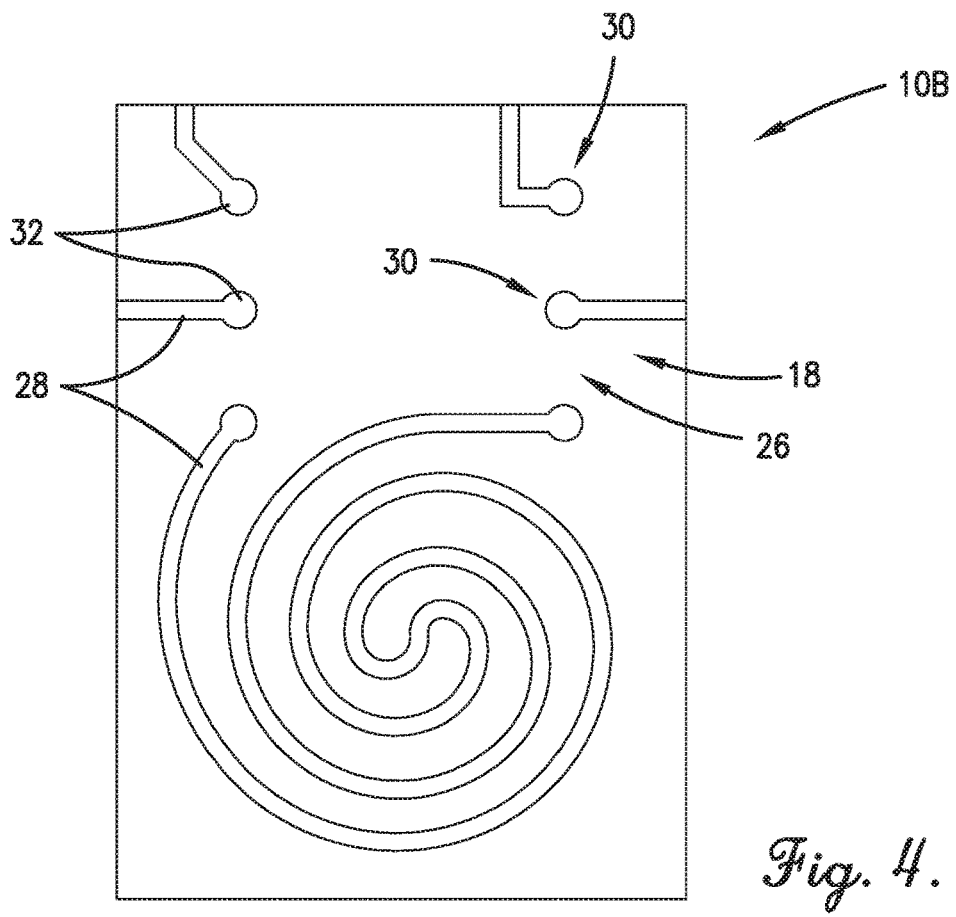
Figure 5:
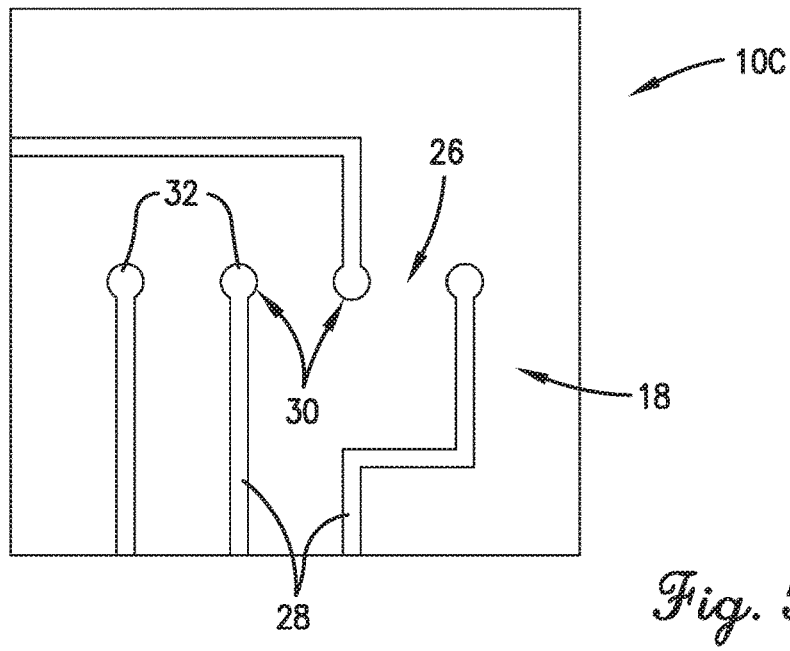
Figure 6:
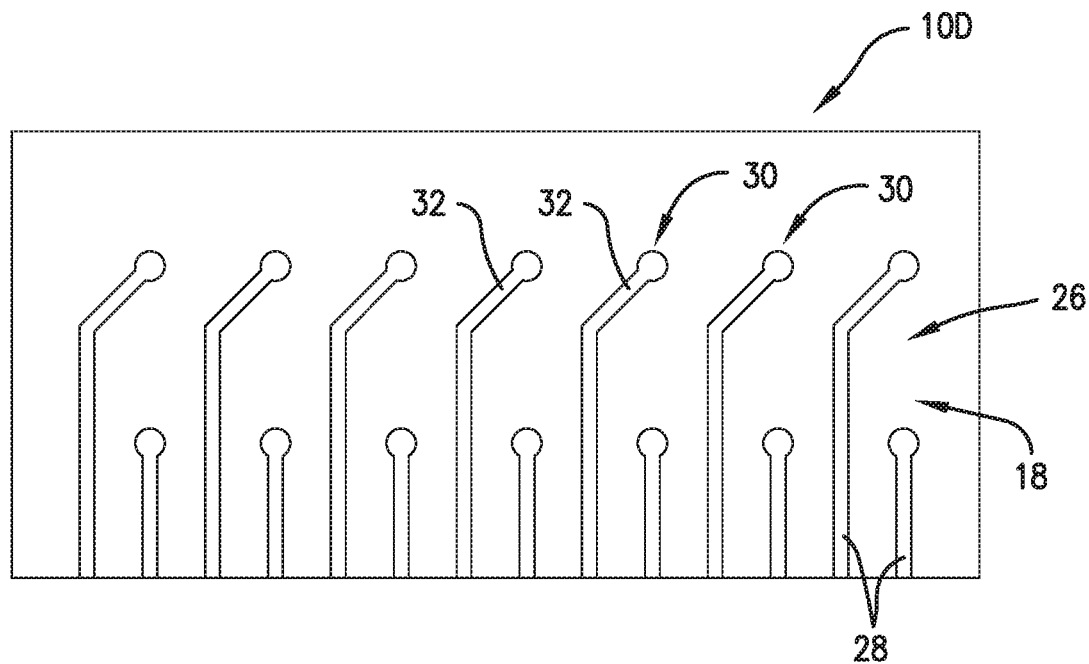
Figure 7:
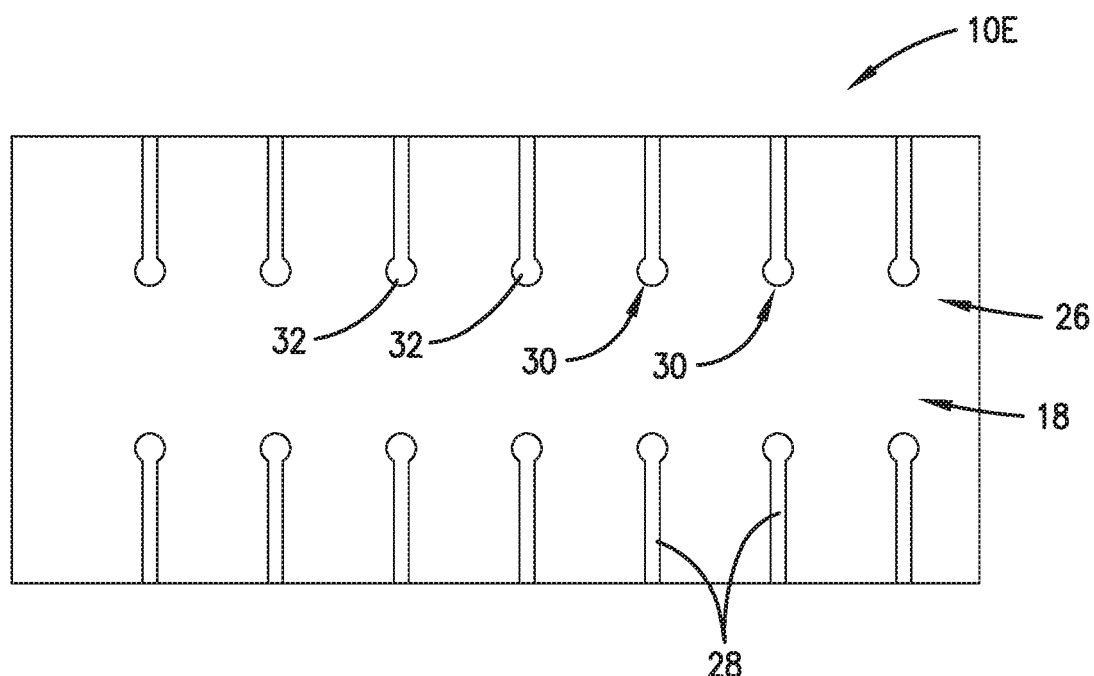
Figure 8:
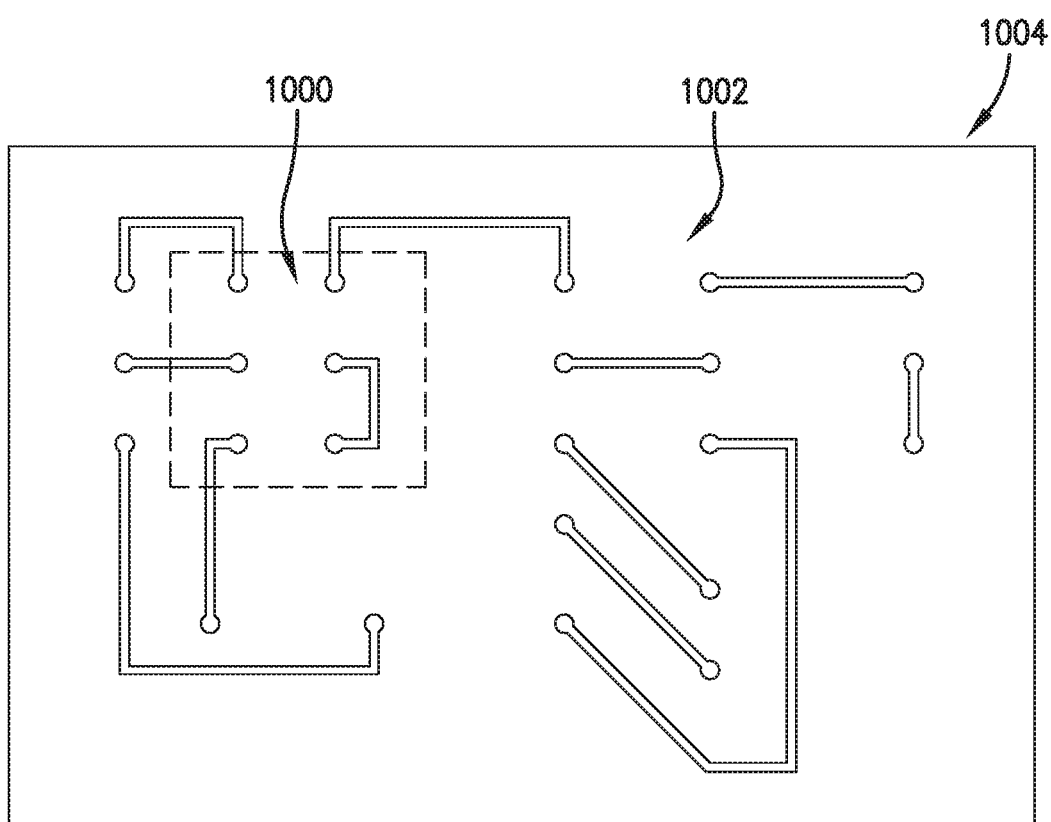
Figure 9:
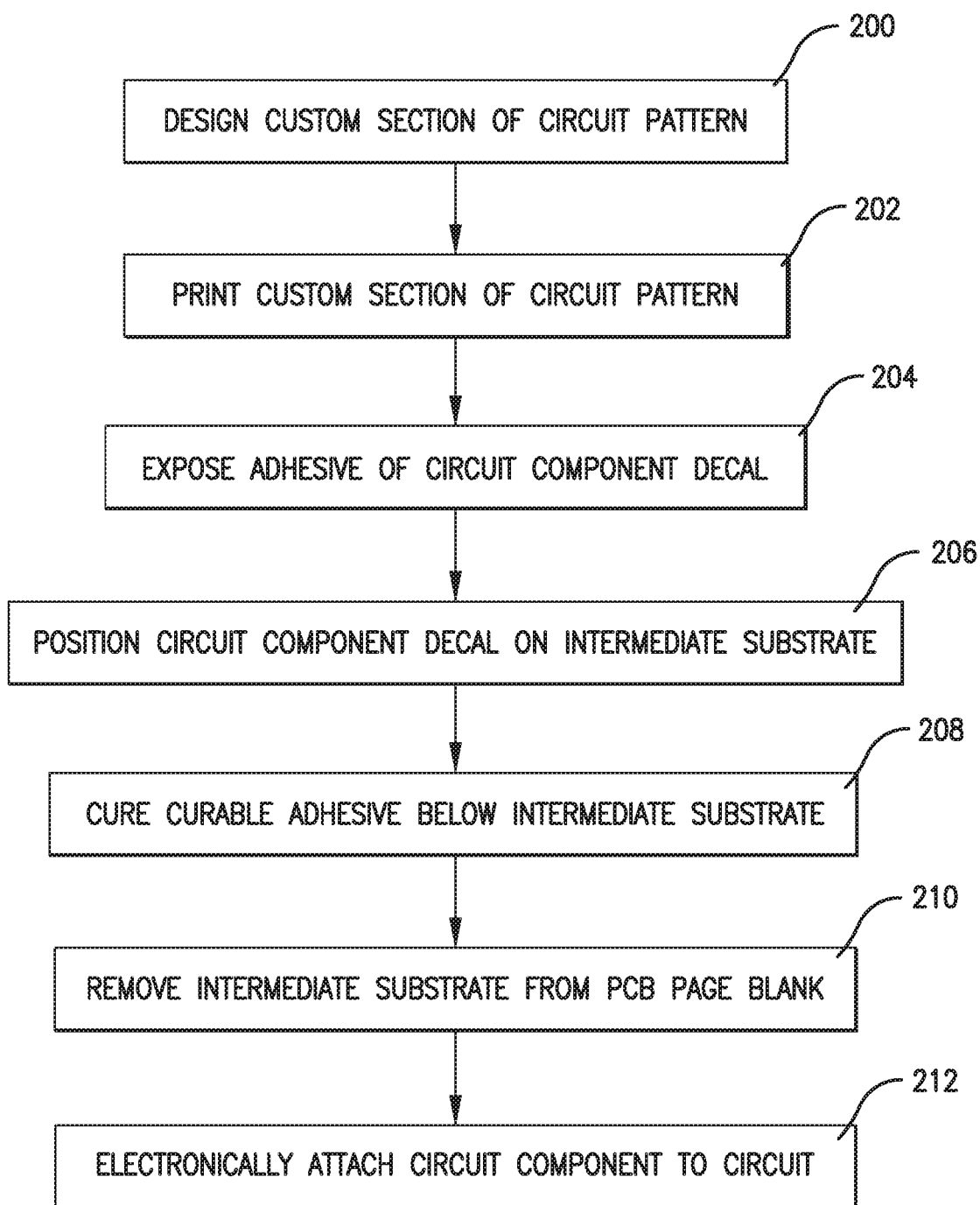

FIG. 3 a plan view of a circuit component decal constructed in accordance with another embodiment of the invention;

FIG. 4 is a plan view of a circuit component decal constructed in accordance with another embodiment of the invention;

FIG. 5 is a plan view of a circuit component decal constructed in accordance with another embodiment of the invention;

FIG. 6 is a plan view of a circuit component decal constructed in accordance with another embodiment of the invention;

FIG. 7 is a plan view of a circuit component decal constructed in accordance with another embodiment of the invention;

FIG. 8 is a plan view of a PCB page blank incorporating a circuit pattern portion of the circuit component decal of FIG. 2; and FIG. 9 is a flow diagram of method steps for using a circuit component decal in accordance with another embodiment of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Turning now to FIGS. 1-8, a circuit component decal 10 constructed in accordance with an embodiment of the invention is illustrated. The circuit component decal 10 is especially suited for forming a section of a circuit pattern on a circuit board or printed circuit board (PCB) page blank via methods such as the ones described in U.S. Pat. No. 9,504,148 (hereinafter, "the '148 patent") and U.S. Pat. No. 9,795,035 (hereinafter, "the '035 patent"), incorporated by reference herein in its entirety. The circuit pattern section (and hence the circuit component decal 10) corresponds to a circuit component 100 having an electronic mechanism 102 and a plurality of leads 104.

The electronic mechanism 102 may be a simple or complex computer chip, an LED, a diode, a resistor, a capacitor, a connector, or any other suitable circuit component. The electronic mechanism 102 may be enclosed by a housing, a protective casing, and/or non-conductive insulation.

The leads 104 extend from the electronic mechanism 102 and are made of a conductive material such as copper or silver-based metal alloys. The leads 104 extend outward or downward from the electronic mechanism and are arranged in a predetermined pattern (corresponding to the circuit component footprint described below). The leads 104 may include two, four, six, nine, fourteen or any other suitable number of leads.

The circuit component decal 10 will now be described in detail. The circuit component decal 10 broadly comprises a transparent sheet 12, an adhesive 14, a removable cover 16, and an opaque circuit pattern 18.

The transparent sheet 12 includes opposing top and bottom sides 20, 22 and a number of edges 24. The transparent sheet 12 may be a small rectangular strip of rigid or flexible material and may be slightly larger in area than its corresponding circuit component. For example, the transparent sheet may be ¼" by ¼", ½" by ½", ½" by ¾", or any other suitable size or shape.

The adhesive 14 is positioned on the bottom side 22 of the transparent sheet 12 for attaching the transparent sheet 12 to an intermediate substrate. The adhesive 14 may be glue, epoxy, or any other type of bonding material. The adhesive 14 may cover the entire bottom side 22 or may only be located in certain areas such as the corners or the middle of the bottom side 22. Alternatively, the adhesive 14 may be applied to the transparent sheet 12 immediately before being positioned on the intermediate substrate.

The removable cover 16 is attached to the transparent sheet 12 over the adhesive 14 for temporarily protecting the adhesive 14. The removable cover 16 may include a tab for allowing a user to peel the removable cover 16 off the adhesive. The removable cover 16 may be made of a material that only loosely bonds to the adhesive so that it can be easily removed therefrom. Alternatively, the removable cover 16 may be at least partially connected to the transparent sheet 12 via a perforated or crimped section.

The opaque circuit pattern 18 is layered on the top side 20 of the transparent sheet 12 and includes an electronic component footprint 26 and a plurality of circuit lead paths 28. The opaque circuit pattern 18 may be printed, etched, or otherwise deposited on the transparent sheet 12. It will be understood that the opaque circuit pattern 18 may alternatively be positioned between the adhesive 14 and the bottom side 22 or embedded in the transparent sheet 12.

The electronic component footprint 26 matches the relative spacing and/or pattern of the leads 104 of the circuit component 100 and includes a plurality of contact points 30 each corresponding to one of the leads 104. The contact points 30 may form contact pad outlines 32, which may be small circles, rectangles, or any other suitable shape. For example, the electronic component footprint 26 may include six contact points 30 in a 2×3 arrangement for basic circuit chips, nine contact points 30 in a 3×3 arrangement for complex chips (see decal 10A of FIG. 3), four in-line contact points 30 for LEDs and diodes (see decal 10C of FIG. 5), two lines of four or more contact points 30 for connectors (see decals 10D and 10E of FIGS. 6 and 7), or any other suitable arrangement. The electronic component footprint 26 may conform to an electronic component model, type, standard, or any other predetermined pattern or pattern characteristic.

The circuit lead paths 28 extend from the contact points 30 to other areas of the transparent sheet 12 and may be straight lines or may have curves, turns, angles, diagonals, splits, junctions, and/or any other suitable features. Some of the circuit lead paths 28 may extend to an edge or edges of the transparent sheet 12. For example, a decal for a connector may include circuit lead paths 28 that may all extend to one edge of the transparent sheet 12 (see decal 10D of FIG. 6) or may extend in two directions to opposite edges of the transparent sheet 12 (see decal 10E of FIG. 7). Some of the circuit lead paths 28 may extend to another contact point 30. In one embodiment, one of the circuit lead paths 28 forms an RF antenna, such as an in-plane spiral antenna (see decal 10B of FIG. 4), or any other circuit component.

Use of the circuit component decal 10 will now be described in detail, with reference to FIGS. 8 and 9. First, a complete circuit pattern 1002, or at least custom sections not including the circuit component section 1000 (inside the dashed line) may be designed via Computer Aided Design (CAD) or by hand, as shown in block 200. The custom sections should match up to the circuit component section 1000 (see dashed line of FIG. 8). Note that this does not require specific knowledge of the circuit component footprint 26. However, the custom sections of the complete circuit pattern 1002 (outside the dashed line) should leave room for or take into account the circuit component section 1000.

Masks corresponding to the custom sections of the circuit pattern 1002 may then be printed, deposited, or etched on an intermediate substrate 1004, as shown in block 202. Alternatively, this may be performed after the circuit component decal 10 is positioned on the intermediate substrate 1004.

The circuit component decal 10 may then be prepared by peeling or removing the removable cover 16 from the adhesive 14 on the bottom side 22 of the transparent sheet 12 so that the adhesive 14 is exposed, as shown in block 204. Alternatively, adhesive material may be applied to the bottom side 22 of the circuit component decal 10.

The circuit component decal 10 may then be placed on the intermediate substrate 1004 so that the opaque circuit pattern 18 forms a mask with the circuit lead paths 28 lining up with circuit lead paths of the custom sections, as shown in block 206. Alternatively, the circuit component decal 10 may be positioned on the intermediate substrate 1004 in a predetermined location before the custom sections are printed or deposited on the intermediate substrate 1004.

Once the circuit component decal 10 and masks of other sections of the complete circuit pattern 1002 are on the intermediate substrate 1004, curing as described in the '148 patent and the '035 patent may begin, as shown in block 208. Specifically, the opaque circuit pattern 18 (and other opaque regions) blocks energy from reaching a first portion of a curable layer under the intermediate substrate 1004 so that a second portion of the curable layer cures and forms bonds with the intermediate substrate 1004 and corresponding portions of the conductive material.

The intermediate substrate 1004 may then be removed from an underlying PCB page blank such that the cured second portion of the curable layer removes conductive material with the intermediate substrate 1004, while the first portion of the curable layer and corresponding conductive material are retained on the PCB page blank, as shown in block 210. The retained conductive material thus forms the circuit pattern 1002 including the circuit pattern section 1000 corresponding to the circuit component 100.

The leads 104 of the circuit component 100 can then be attached to the PCB page blank at the circuit component section 1000 so that the electronic mechanism 102 is electrically connected to the rest of the circuit, as shown in block 212. Other circuit components, connectors, and wires may also be connected to the circuit as needed.

The above-described circuit component decal 10 provides several advantages. For example, the circuit component decal 10 allows users to incorporate circuit components into electronic circuits without expertise or specific knowledge of the circuit components. This also significantly reduces the amount of time required to develop circuit designs, since users do not need to measure, research, or recreate the footprints of the circuit components. In some embodiments, circuit components can easily be replaced in the design process with other circuit components having different footprints without having to draw the new footprints and associated lead paths. Instead, the circuit component decal 10 is replaced with a decal of another circuit component having the same lead paths. The circuit component decal 10 is also compatible with selective adhesion procedures and can be incorporated into other circuit design and circuit manufacturing procedures.

The above-described circuit component decal 10 has been described in terms of an opaque "positive" circuit pattern. That is, the opaque circuit pattern corresponds directly to conductive traces, leads, contact points, and other conductive areas. However, it will be understood that the circuit component decal 10 can instead include an opaque negative circuit pattern in which an opaque portion corresponds to non-conductive areas between conductive traces, leads, and contact points, while a transparent portion corresponds to the circuit pattern.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A circuit component decal for masking an intermediate substrate, the circuit component decal comprising:
   a transparent sheet having opposing top and bottom surfaces; and
   an opaque circuit pattern on the top surface, the opaque circuit pattern including:
   an electronic component footprint including a plurality of contact points; and
   a plurality of circuit lead paths extending from the plurality of contact points, the opaque circuit pattern corresponding to only a section of a complete circuit pattern, the opaque circuit pattern being configured to block energy from reaching a first portion of the intermediate substrate when the transparent sheet is positioned on the intermediate substrate so as to form the section of the complete circuit pattern.

2. The circuit component decal of claim 1, further comprising an adhesive on the bottom surface for attaching the transparent sheet to the intermediate substrate.

3. The circuit component decal of claim 2, further comprising a removable cover configured to be peeled from the bottom surface so as to expose the adhesive.

4. The circuit component decal of claim 1, wherein the plurality of contact points include contact pads.

5. The circuit component decal of claim 1, wherein the transparent sheet includes a plurality of edges and the circuit lead paths extend to the edges.

6. The circuit component decal of claim 1, wherein the transparent sheet includes a plurality of edges and the circuit lead paths extend to only one of the edges.

7. The circuit component decal of claim 1, wherein the opaque circuit pattern further includes a circuit component.

8. The circuit component decal of claim 1, wherein the opaque circuit pattern is printed on the top surface of the transparent sheet.

9. The circuit component decal of claim 1, wherein the transparent sheet is flexible.

10. The circuit component decal of claim 1, wherein one of the circuit lead paths connects two contact points together.

11. A circuit component decal for masking a circuit board page blank, the circuit component decal comprising:
    a transparent sheet having opposing top and bottom surfaces; and
    an opaque negative circuit pattern on the top surface, the opaque negative circuit pattern outlining:
        an electronic component footprint including a plurality of contact points; and
        a plurality of circuit lead paths extending from the plurality of contact points, the opaque negative circuit pattern corresponding to only a section of a complete circuit pattern, the opaque negative circuit pattern being configured to block energy from reaching a first portion of the circuit board page blank when the transparent sheet is positioned over the circuit board page blank such that a second portion of the circuit board page blank retains conductive material so as to form the section of the complete circuit pattern.

12. The circuit component decal of claim 11, further comprising an adhesive on the bottom surface for attaching the transparent sheet to a substrate.

13. The circuit component decal of claim 12, further comprising a removable cover configured to be peeled from the bottom surface so as to expose the adhesive.

14. The circuit component decal of claim 11, wherein the plurality of contact points are shaped as contact pads.

15. The circuit component decal of claim 11, wherein the transparent sheet includes a plurality of edges and the circuit lead paths extend to the edges.

16. The circuit component decal of claim 11, wherein the transparent sheet includes a plurality of edges and the circuit lead paths extend to only one of the edges.

17. The circuit component decal of claim 11, wherein the opaque negative circuit pattern further outlines a circuit component.

18. The circuit component decal of claim 11, wherein the opaque negative circuit pattern is printed on the top surface of the transparent sheet.

19. The circuit component decal of claim 11, wherein the transparent sheet is flexible.

20. A circuit component assembly for integration with an electronic circuit board, the circuit component assembly comprising:
    a circuit component including:
        an electronic mechanism for manipulating electrical current;
        a plurality of leads extending from the electronic mechanism for connecting the electronic mechanism to traces of the electronic circuit board; and
    a circuit component decal for masking an intermediate substrate, the circuit component decal comprising:
        a transparent sheet having opposing top and bottom surfaces; and
        a circuit pattern on the top surface, the circuit pattern including:
            a footprint of the circuit component, the footprint including a plurality of contact points corresponding to the plurality of leads; and
            a plurality of circuit lead paths extending from the plurality of contact points, the circuit pattern corresponding to only a section of a complete circuit pattern, the circuit pattern being configured to block energy from reaching a first portion of the intermediate substrate when the transparent sheet is positioned on the intermediate substrate so as to form the section of the complete circuit pattern, the leads of the circuit component being configured to be connected to the section of the complete circuit pattern via the contact points.

* * * * *